United States Patent
Hohage et al.

(10) Patent No.: US 8,546,274 B2
(45) Date of Patent: Oct. 1, 2013

(54) INTERLAYER DIELECTRIC MATERIAL IN A SEMICONDUCTOR DEVICE COMPRISING STRESSED LAYERS WITH AN INTERMEDIATE BUFFER MATERIAL

(75) Inventors: Joerg Hohage, Dresden (DE); Michael Finken, Dresden (DE); Ralf Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 144 days.

(21) Appl. No.: 12/835,967

(22) Filed: Jul. 14, 2010

(65) Prior Publication Data
US 2010/0276790 A1 Nov. 4, 2010

Related U.S. Application Data

(63) Continuation of application No. 12/166,458, filed on Jul. 2, 2008, now Pat. No. 7,875,561.

(30) Foreign Application Priority Data
Dec. 31, 2007 (DE) .......................... 10 2007 063 272

(51) Int. Cl.
H01L 21/31 (2006.01)
(52) U.S. Cl.
USPC ......................................... 438/783; 257/369
(58) Field of Classification Search
USPC .......................... 438/783; 257/369, E27.064
See application file for complete search history.

(56) References Cited

U.S. PATENT DOCUMENTS

| 5,627,403 | A | * | 5/1997 | Bacchetta et al. | 257/639 |
|---|---|---|---|---|---|
| 7,875,561 | B2 | * | 1/2011 | Hohage et al. | 438/783 |
| 8,034,726 | B2 | * | 10/2011 | Richter et al. | 438/783 |
| 2003/0181005 | A1 | * | 9/2003 | Hachimine et al. | 438/231 |
| 2006/0027924 | A1 | | 2/2006 | Chen et al. | 257/751 |
| 2006/0197117 | A1 | * | 9/2006 | Kim et al. | 257/250 |
| 2006/0223290 | A1 | | 10/2006 | Belyansky et al. | 438/520 |
| 2007/0018203 | A1 | * | 1/2007 | Atanackovic et al. | 257/254 |
| 2007/0249113 | A1 | * | 10/2007 | Grudowski et al. | 438/199 |
| 2009/0108335 | A1 | | 4/2009 | Hohage et al. | 257/327 |
| 2009/0166800 | A1 | | 7/2009 | Richter et al. | 257/506 |

FOREIGN PATENT DOCUMENTS

| DE | 102004031744 A1 | 7/2006 |
|---|---|---|
| DE | 102007016897 A1 | 8/2008 |
| DE | 102007052051 A1 | 5/2009 |

OTHER PUBLICATIONS

Translation of Official Communication from German Patent Office for German Patent Application No. 10 2007 063 272.1 dated Oct. 24, 2008.

(Continued)

*Primary Examiner* — Yu-Hsi D Sun
(74) *Attorney, Agent, or Firm* — Williams, Morgan & Amerson, P.C.

(57) ABSTRACT

A highly stressed dielectric material, such as a tensile stressed material, may be deposited in a conformal manner so as to respect any deposition constraints caused by pronounced surface topography of highly scaled semiconductor devices, followed by the deposition of a buffer material having enhanced gap-filling capabilities. Thereafter, a further stress-inducing layer is deposited to form a doublet structure, which acts on the transistor elements, thereby enhancing overall performance, without increasing the probability of creating deposition-related irregularities. Hence, production yield as well as performance of highly scaled semiconductor devices may be increased.

14 Claims, 7 Drawing Sheets

(56) References Cited

OTHER PUBLICATIONS

Translation of Official Communication from German Patent Office for German Patent Application No. 10 2007 063 272.1-33 dated Sep. 7, 2009.

Office Action dated Jan. 21, 2010 from parent U.S. Appl. No. 12/166,458.
Final Office Action dated May 10, 2010 from parent U.S. Appl. No. 12/166,458.

* cited by examiner

INTERLAYER DIELECTRIC MATERIAL IN A SEMICONDUCTOR DEVICE COMPRISING STRESSED LAYERS WITH AN INTERMEDIATE BUFFER MATERIAL

CROSS-REFERENCE TO RELATED APPLICATION

This is a continuation of application Ser. No. 12/166,458, filed Jul. 2, 2008 now U.S. Pat. No. 7,875,561.

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors used for generating strain in channel regions of the transistors.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency and increased yield loss when device dimensions are increasingly scaled by using the 90 nm technology and even further advanced approaches, due to the limited conformal deposition capabilities of the deposition process involved, which may result in respective process non-uniformities during subsequent process steps for patterning the stressed layer and forming contact openings, as will be explained in more detail with reference to FIGS. 1a-1b.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise a gate electrode 121 formed on a respective gate insulation layer, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device in which critical dimensions, such as the gate length, i.e., in FIG. 1a, the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration, in dense device areas, a plurality of closely spaced circuit elements may be provided.

It should be appreciated that the first and second device regions 120A, 120B may be separated by an appropriate isolation structure (not shown) if required. Furthermore, in the manufacturing stage shown in FIG. 1a, a silicon nitride layer 130 comprising a high intrinsic stress may be formed above the first and second device areas 120A, 120B followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device areas 120A, 120B.

As is evident from FIG. 1a, due to the reduced spacing between neighboring transistor elements, the silicon nitride layer 130 may define a respective surface topography in which tapered recesses, also referred to as seams 132, may be formed between the closely spaced transistor elements, since the spacing between the transistor elements may be in the order of two times a layer thickness of the silicon nitride layer 130, which, in combination with the limited conformal fill behavior, may even result in corresponding defects, such as voids 132A and the like.

Furthermore, in this manufacturing stage, the semiconductor device 100 may comprise a resist mask 103 exposing the first device area 120A while covering the second device region 120B. In this case, it may be assumed that the intrinsic stress of the silicon nitride layer 130 may be appropriately selected so as to enhance the transistor performance in the second device area 120B, which may, for instance, include N-channel transistors requiring a high tensile stress in the layer 130.

A typical process flow for forming the semiconductor device 100 as shown in FIG. 1a may comprise the following processes. The gate electrodes 121 and the gate insulation layers may be formed and patterned on the basis of well-established process techniques including advanced photolithography, deposition, oxidation and etch techniques. Thereafter, the drain and source regions 125 may be formed in combination with the sidewall spacer structures 122 on the basis of well-established deposition processes, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed followed by the deposition of the silicon nitride layer 130. During the deposition of the silicon nitride material, respective process parameters, such as composition of carrier gases and reactive gases, substrate temperature, deposition pressure and, in particular, ion bombardment during the deposition, may significantly influence the finally obtained intrinsic stress of the material as deposited with respect to the underlying materials. For example, when the layer 130 is deposited with high tensile stress of up to 1 GPa or even significantly higher, the ion bombardment is reduced, for instance, by establishing the deposition atmosphere with a low level of radio frequency (RF) power so as to obtain the desired tensile property of the material as deposited. However, the moderately low RF power may result in reduced surface diffusion of the reactive species in the deposition ambient, thereby compromising conformality. Due to the less pronounced conformality of the silicon nitride deposition process above a certain layer thickness and for increased aspect ratios, as may occur in highly scaled devices, caused by the reduced distance between the neighboring transistor elements at moderately dimensioned gate heights in densely packed device areas, as shown, the silicon nitride material may merge in the lateral growth direction between closely spaced transistor elements, thereby forming the respective seam 132, or respective overhangs may form, thereby resulting in the void 132A. Thus, in the subsequent deposition of the silicon dioxide layer 131, the local deposition conditions at the seam 132 may result in a non-uniformity of the layer thickness, thereby giving rise to respective etch non-uniformities in a contact etch process to be performed in a later stage.

After the deposition of the silicon dioxide layer 131, the resist mask 103 may be formed on the basis of well-established photolithography techniques. Next, an appropriately designed etch process may be performed in order to remove a portion of the layers 130 and 131 from the first device area 120A. During the corresponding etch process, the silicon dioxide material of the layer 131 may be removed first followed by a selective etch process for removing the material of the silicon nitride layer 130, wherein the corresponding etch process may be controlled on the basis of an etch stop layer, if required. Due to the significantly increased layer thickness of the silicon dioxide layer 131 at the seam 132, the material may not be completely removed during the etch process when removing the layer 131, thereby significantly blocking the selective etch chemistry during the subsequent etch process for removing the exposed portion of the silicon nitride layer 130.

Consequently, respective material residuals may remain between the transistors in the first device area 120A, which may result in respective non-uniformities during the further processing, for instance, during the deposition of a further dielectric layer of high intrinsic stress designed to enhance the transistor performance of the transistors in the first device area 120A.

FIG. 1b schematically illustrates the semiconductor device 100 at a further advanced manufacturing stage. As shown, a second dielectric layer 140, for instance having a compressive stress, may be formed above the first and second device areas 120A, 120B. Consequently, due to the material residual 132 previously produced during the removal of the tensile layer 130, the respective stress transfer mechanism may be deteriorated, while additionally the residual 132 may provide respective etch non-uniformities in the subsequent patterning sequence for forming respective contact openings. Similarly, the void 132A in the second device region 120B may also result in a reduced stress transfer mechanism, as well as degraded etch uniformity during the subsequent processing.

As a consequence, upon further device scaling, the respective limitation of deposition processes for dielectric materials of high intrinsic stress, in particular for tensile-stressed silicon nitride, may require a significant reduction of the layer thickness to comply with increased aspect ratios encountered in advanced device geometries. However, in this case, the respective strain induced by the stressed dielectric materials may also be significantly reduced, thereby also reducing transistor performance, in particular performance of N-channel transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of reduced efficiency of strain-inducing mechanisms in sophisticated transistor elements and/or of respective non-uniformities during the patterning of contact openings by providing a technique in which a substantially conformal deposition behavior is used by appropriately selecting the thickness of the highly stressed material, thereby significantly reducing the probability of creating voids or seems during the deposition of the highly stressed dielectric material. Moreover, the pronounced surface topography of the resulting structure may be reduced by the deposition of a buffer material, which may be formed with a significantly reduced internal stress level compared to the actual stress-inducing materials, thereby enabling enhanced flexibility in selecting appropriate deposition techniques and parameters to provide increased gap-filling capabilities of the deposition technique. Consequently, by providing the buffer material, the previously created surface topography may be significantly relaxed and may therefore provide a surface geometry that enables a further, less critical deposition of a highly stressed dielectric material. In this way, a "doublet" of highly stressed dielectric material layers with an intermediate buffer material may be provided, which therefore results in an overall increase of the stressed dielectric material in the vicinity of the respective transistor elements while nevertheless reducing the probability of creating non-uniformities during the further processing. Consequently, upon further device scaling, thereby reducing the distance between neighboring gate electrode structures in densely packed device regions, the gap-filling capabilities of the respective deposition process may be taken into consideration by forming the two highly stressed dielectric layers in a highly conformal manner, while nevertheless providing an overall increase of the amount of stressed dielectric material that may be positioned in the vicinity of the transistor of interest. For example, the significant restriction for a tensile stressed dielectric material formed on the basis of PECVD silicon nitride may be relaxed by the doublet stress layer approach, which may result in a significant performance gain for N-channel transistors, even for technology standards corresponding to the 65 nm node and beyond.

One illustrative method disclosed herein comprises conformally forming a first stress-inducing layer above a plurality of transistors that are formed above a substrate, wherein the first stress-inducing layer generates a first type of stress. The method further comprises forming a first dielectric layer above the first stress-inducing layer, wherein the first dielectric layer has an internal stress level that is less than a stress level of the first stress-inducing layer. Moreover, a second stress-inducing layer is formed above the first dielectric layer and induces the first type of stress. Finally, the method comprises forming a second dielectric layer above the second stress-inducing layer.

A further illustrative method disclosed herein comprises forming a first stress-inducing dielectric layer above a plurality of transistors in a substantially conformal manner by using a first deposition technique. The method additionally comprises forming a buffer material above the first stress-inducing layer by using a second deposition technique having an increased gap-filling capability compared to the first deposition technique. The method further comprises forming a second stress-inducing dielectric layer above the buffer material, wherein the first and second stress-inducing layers produce the same type of stress. Finally, the method comprises forming a dielectric material above the second stress-inducing dielectric layer to form an interlayer dielectric stack.

One illustrative semiconductor device disclosed herein comprises an interlayer dielectric layer stack formed above a plurality of transistors. The interlayer dielectric layer stack comprises a first stress-inducing layer located next to the plurality of transistors, a buffer material formed above the first stress-inducing layer and a second stress-inducing layer that is formed above the buffer material. Furthermore, the layer stack comprises a final dielectric material, wherein, in the interlayer dielectric layer stack, the first and second stress-inducing layers induce the same type of stress.

BRIEF DESCRIPTION OF THE DRAWINGS

The disclosure may be understood by reference to the following description taken in conjunction with the accompanying drawings, in which like reference numerals identify like elements, and in which.

Figure 1A:
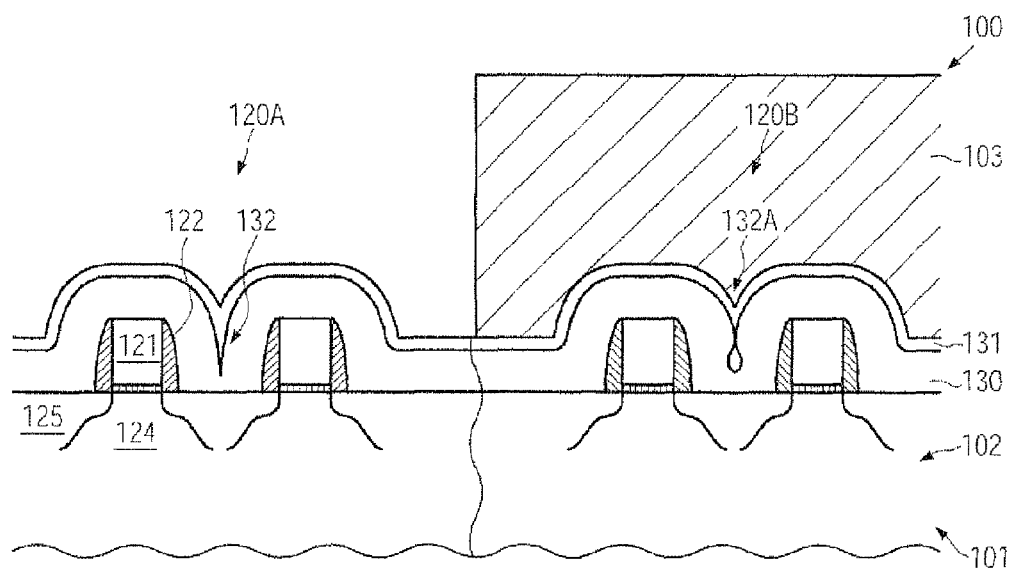
FIGS. 1a-1b schematically illustrate cross-sectional views of a semiconductor device during various manufacturing stages in forming differently stressed contact etch stop layers, wherein the semiconductor device includes closely spaced transistor elements, according to conventional techniques.
Figure 1B:
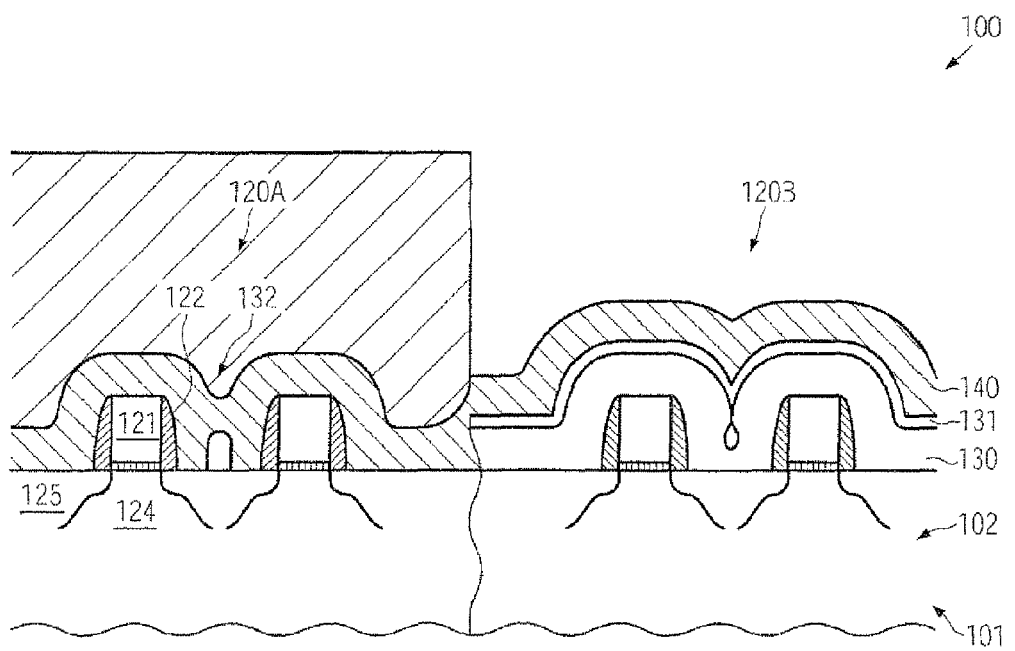

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides methods and semiconductor devices based on a "doublet" configuration in the contact structure, in which performance of at least one type of transistor may be enhanced by dividing a highly stressed dielectric material into separate layers, each of which may exhibit a substantially conformal configuration. For this purpose, after the deposition of the first conformal stress-inducing material, a buffer material, such as a dielectric material as is usually employed as interlayer dielectric material, for instance in the form of silicon dioxide and the like, may be deposited on the basis of a deposition technique providing enhanced gap-filling capabilities, thereby reducing the overall surface topography. In a subsequent deposition step, a further highly stressed dielectric material may be deposited in a substantially conformal manner as may be compatible with the deposition capabilities of the deposition process under consideration and the device geometry as created by the previous deposition of the buffer material. Consequently, during both deposition steps for forming the highly stressed dielectric materials, a reduced probability for creating any irregularities, such as voids or seams, may be accomplished, thereby contributing to the scalability of the doublet configuration, while nevertheless providing an increased amount of highly stressed dielectric material in the vicinity of the transistor elements under consideration.

For example, the constraints of a deposition process for forming a highly tensile stressed silicon nitride material may be respected by appropriately selecting a thickness of the first stressed dielectric material in conformity with the overall device geometry, wherein the subsequent deposition of the buffer material on the basis of a technique with improved gap-filling capabilities may provide a less pronounced surface topography or may at least maintain a similar surface topography as encountered by the first deposition step, thereby enabling the deposition of a further dielectric material with reduced probability for creating voids and seams. Hence, a significant performance gain for N-channel transistors may be achieved since the overall amount of highly stressed material in the vicinity of the transistors may be increased compared to conventional dual stress liner approaches in which a reduced layer thickness has to be used unless risking an inappropriate increase of yield loss due to irregularities, such as voids and seams. Although the doublet configuration may be highly advantageous in view of enhancing performance of N-channel transistors, the respective technique may also be applied to P-channel transistors when requiring a compressive dielectric material. Furthermore, in some illustrative aspects disclosed herein, a high degree of compatibility with conventional integration schemes for forming an interlayer dielectric layer stack may be accomplished by providing the buffer material on the basis of a deposition technique, such as a thermally activated chemical vapor deposition (CVD) process for forming a silicon dioxide material using TEOS, which is a well-established deposition technique.

Consequently, based on the principles disclosed herein, the amount of stressed material may be increased compared to conventional dual stress liner approaches without substantially sacrificing yield, due to the reduced surface topography obtained by the intermediate buffer material. Hence, the subject matter disclosed herein may be advantageously applied to highly scaled semiconductor devices including transistor elements having a gate length of 50 nm and less.

Figure 2A:
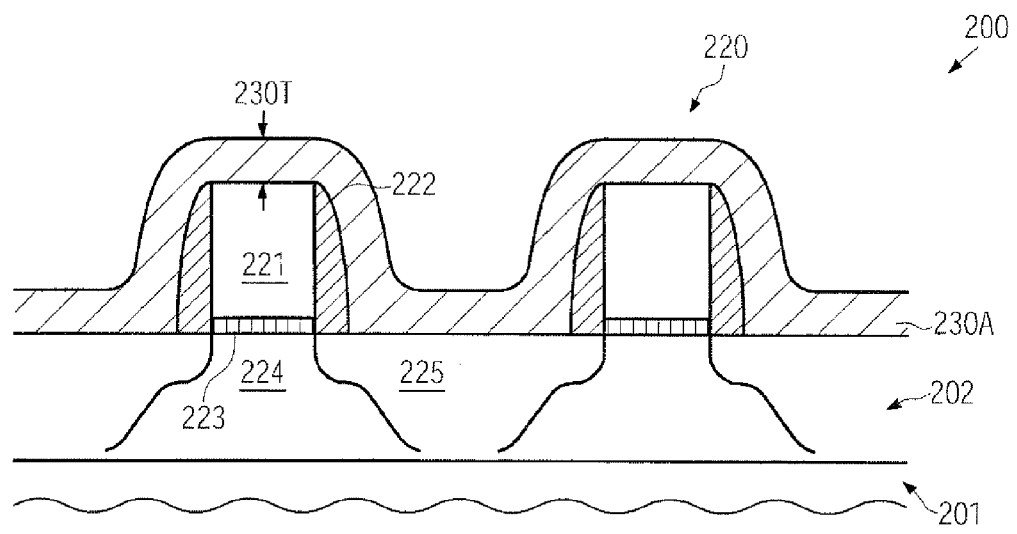
FIGS. 2a-2g schematically illustrate cross-sectional views of a semiconductor device including a plurality of densely packed transistor elements in various manufacturing stages for forming a highly stressed dielectric material, such as a tensile stressed dielectric material, in a "doublet" configuration with an intermediate buffer material, according to illustrative embodiments.

FIG. 2a schematically illustrates a semiconductor device 200 comprising a substrate 201 having formed thereabove a semiconductor layer 202. The substrate 201 may represent any appropriate carrier material for forming thereon the semiconductor layer 202, which may comprise a significant portion of silicon, possibly in combination with other components, such as germanium, carbon, tin and the like, when, for instance, embedded strain-inducing mechanisms are considered. Furthermore, depending on the device requirements, the substrate 201, in combination with the semiconductor layer 202, may form an SOI configuration, wherein a "buried" insulating material is formed below the semiconductor layer 202. In other cases, the substrate 201 may represent a substantially crystalline semiconductor material, wherein the semiconductor layer 202 may represent an upper portion thereof to thereby provide a "bulk" configuration. It should be appreciated, however, that a mixture of an SOI configuration and a bulk configuration may be provided in the semiconductor device 200, depending on the overall device requirements.

The semiconductor device 200 may further comprise a plurality of transistor elements 220, which may represent "densely spaced" transistor elements, wherein a distance between neighboring transistor elements is comparable or even less than the overall transistor dimensions, at least in one lateral dimension. In the embodiment shown, the transistor elements 220 may comprise a gate electrode structure 221, which may be comprised of an appropriate conductive material, such as polysilicon, possibly in combination with metal silicide, or any other appropriate materials, which may comprise a more or less amount of metal and the like. The gate electrode structures 221 may be separated from a channel region 224 by a gate insulation layer 223, which may comprise any appropriate material, such as silicon dioxide, silicon oxynitride, high-k dielectric materials and the like. Furthermore, the drain and source regions 225 may be defined in the semiconductor layer 202 so as to form respective PN junctions with the channel region 224. Moreover, the gate electrode structure 221 may include a spacer structure 222, which may have any appropriate width, depending on the overall process and device requirements. For example, the spacer structure 222 may comprise materials, such as silicon dioxide and/or silicon nitride and the like. It should be appreciated that, in other illustrative embodiments (not shown), the spacer structure 222 may be provided with a significantly reduced width or may be formed with a substantially conformal configuration so as to enable the positioning of highly stressed material more closely to the channel region 224. It should be appreciated that, in the cross-sectional view of FIG. 2*a*, the horizontal lateral dimension corresponds to the transistor length direction. Hence, the gate length of the gate electrode structure 221 is substantially defined by the horizontal extension of the gate electrode 221, which substantially determines a channel length of the channel 224. In sophisticated applications, the length of the gate electrode structure 221 may be approximately 50 nm and less so that a corresponding lateral distance between adjacent gate electrode structures including the spacer structures 222 may be 100 nm and even less in densely packed device regions, in which a plurality of gate electrode structures may be positioned in parallel.

Consequently, a certain surface topography may be defined by the transistors 220, above which is formed a highly stressed dielectric layer 230A, which may be provided in a substantially conformal configuration. That is, the highly stressed dielectric layer 230A may have substantially uniform layer thickness, irrespective of whether the thickness is to be taken at substantially horizontal portions or substantially vertical portions. For example, a thickness 230T of the layer 230A may be taken at the top of the gate electrodes 221 and this thickness 230T may be approximately the same at any position in and adjacent to the transistor 220. It should be appreciated that "approximately" in this sense is to be understood as specifying a range corresponding to +/−10-15% of the value 230T as determined on top of the gate electrode 221. In some illustrative embodiments, the layer 230A may comprise a tensile stressed dielectric material having an internal stress level of approximately 1 GPa and higher so as to create a certain tensile force on the transistors 220, thereby finally resulting in a respective strain in the channel regions 224. As previously noted, in a standard crystallographic configuration of a silicon-based semiconductor material, a respective tensile strain in the channel region 224 may result in an increased electron mobility, thereby obtaining an increased transistor performance for N-channel transistors.

The semiconductor device 200 as shown in FIG. 2A may be formed on the basis of substantially the same process techniques as previously described with reference to the device 100. That is, the transistors 220 may be formed on the basis of well-established techniques in compliance with the respective design rules, which may result in a specified gate length and a respective distance between neighboring transistors. After having completed the transistors 220, the dielectric material 230A may be deposited on the basis of an appropriate deposition technique, such as a PECVD process, in which silicon nitride material may be deposited on the basis of well-established recipes. As previously explained, during the deposition of the layer 230A so as to exhibit a high tensile stress, a reduced RF power may result in a reduced surface diffusivity of the reactive components so that only very moderate gap-filling capabilities may be obtained. Hence, the thickness 230T is selected such that a substantially conformal deposition behavior is obtained, thereby substantially avoiding the merging of the material of the layer 230A between adjacent two of the transistors 220 which may otherwise result in voids or seams, as previously explained. Thus, for a given set of process parameters, which may be selected to obtain the desired high internal stress level, the thickness 230T may be selected in accordance with the design rules such that a substantially conformal deposition behavior is obtained. For instance, for a distance between adjacent transistors 220 of approximately 200 nm, the thickness 230T may be selected to be approximately 100 nm or less to reduce the probability of creating deposition-related irregularities. For example, the thickness 230T may be selected to be approximately 80 nm and less for gate electrode structures 221 having a length of approximately 50 nm. For further scaled transistor elements, appropriately adapted values for the thickness 230T may be selected, for instance, to approximately 60 nm and less.

Figure 2B:
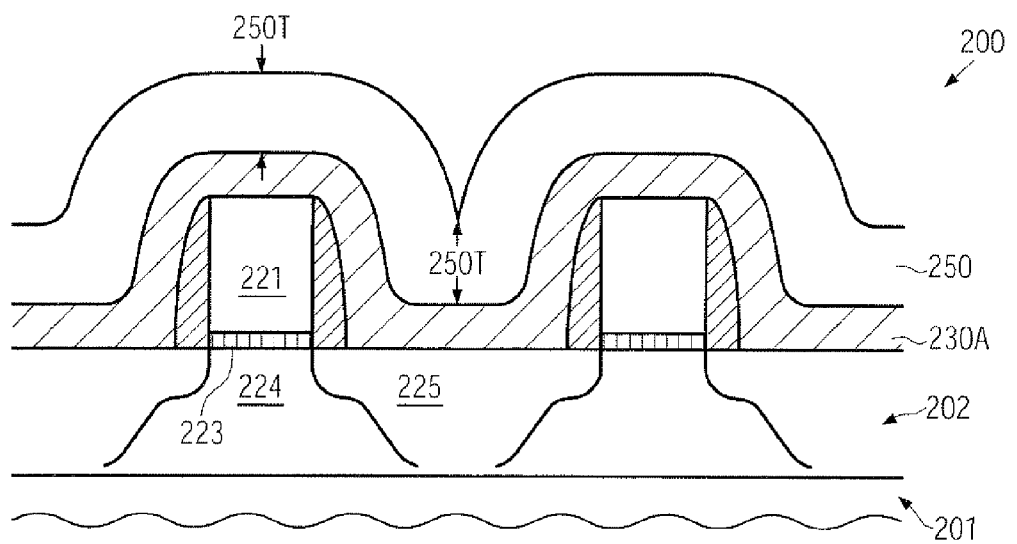

FIG. 2*b* schematically illustrates the semiconductor device 200 in a further advanced manufacturing stage. As shown, the semiconductor device 200 may further comprise a buffer material 250 that is formed on the stress-inducing layer 230A, wherein the material 250 may reliably fill the gap between the adjacent transistors 220, thereby providing a "non-conformal" configuration. That is, a thickness 250T may significantly vary, depending on the underlying surface topography. For example, the value of the thickness 250T above the top face of the gate electrode 221 may be less than a value between the adjacent transistors 220, wherein a difference may be in the range of approximately 30-100% or even more, depending on the material characteristics and the deposition technique used for forming the buffer material 250. Consequently, the thickness 250T may be referred to as an average thickness of the material 250, which may represent any appropriate representation of the various thickness values obtained for the material 250. In this sense, an "average" thickness of the material 250 may even be represented by a value taken at substantially horizontal device portions, such as above the top face of the gate electrode 221, which may typically represent the smallest thickness value. In some illustrative embodiments, the buffer material 250 may be comprised of a silicon dioxide material to provide a high degree of compatibility with conventional interlayer dielectric stacks, in which silicon dioxide formed of TEOS may frequently be used. In some illustrative embodiments, the average thickness 250T may be greater than the thickness 230T of the previously formed layer 230A, thereby providing, in combination with the non-conformal configuration, a reduced surface topography. For example, the average thickness 250T may range from approximately 100 nm to several hundred nm, while in other illustrative embodiments (not shown) the buffer material 250 may be provided with a thickness 250T that is comparable with the thickness of the layer 230A as long as a non-conformal configuration may be obtained in order to reliably fill the spaces between the adjacent transistors 220.

The buffer material 250 may be formed on the basis of an appropriate deposition technique having enhanced gap-filling capabilities compared to the deposition technique for forming the layer 230A, as previously explained. For instance, in some illustrative embodiments, the buffer material 250 may be deposited on the basis of a thermally activated CVD technique, such as sub-atmospheric CVD (SACVD), which may enable a deposition of, for instance, silicon dioxide material with enhanced gap-fill capabilities compared to, for instance, PECVD techniques. For this purpose, TEOS (tetra ethyl orthosilicate) may be used in combination with a moderately high process pressure of approximately 200-700 Torr, thereby obtaining a substantially flow-like deposition behavior. In other illustrative examples, any other appropriate deposition technique may be used, as long as process parameters may be selected such that at least the gap between the neighboring transistors 220 may be reliably filled to provide a less critical surface topography for a subsequent further deposition of a highly stressed dielectric material. For instance, PECVD techniques for depositing silicon dioxide may be appropriate as long as the gap-filling capabilities are achieved and a high degree of compressive stress may be avoided in the buffer material 250, which may otherwise adversely affect the overall strain-inducing mechanism.

Figure 2C:
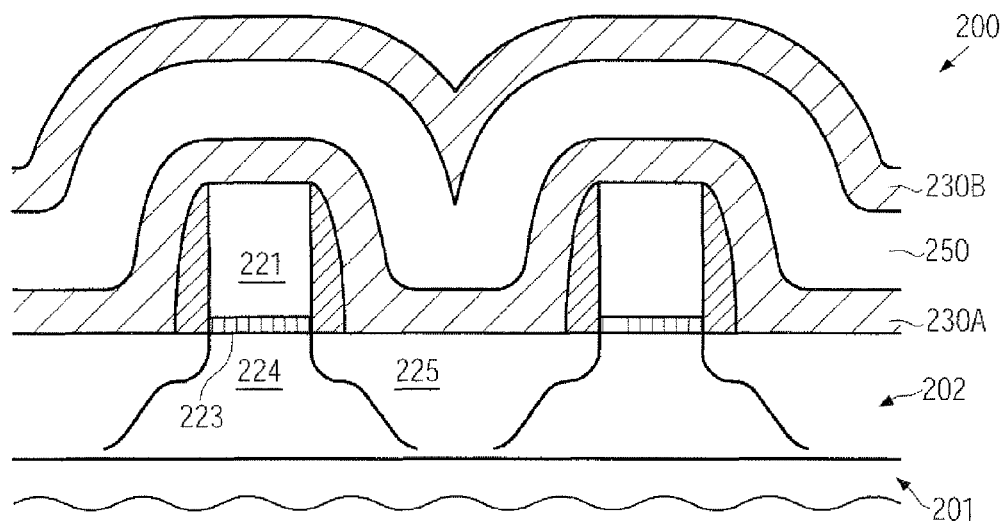

FIG. 2c schematically illustrates the semiconductor device 200 in a manufacturing stage in which a further stress-inducing dielectric material 230B is formed above the buffer material 250. The layers 230A, 230B exhibit the same type of internal stress, for instance, a tensile stress, to increase the amount of tensile stressed dielectric material that is positioned in the vicinity of the transistors 220. The layer 230B may be provided as a substantially conformal layer to reduce the probability of creating any deposition-related irregularities, wherein, however, the buffer material 250 may provide appropriate surface conditions that may enable the deposition of the material 250T with a thickness that is comparable to or greater than the thickness 230T of the layer 230A. With respect to a deposition technique for forming the layer 230B, substantially the same criteria apply as previously explained with reference to the layer 230A.

Thus, the high tensile stress of the layer 230B may act on the buffer material 250, thereby creating a respective deformation and strain therein, which may in turn increase the overall tensile stress forces created by the initial layer 230A. Consequently, the overall tensile force acting on the transistors 220 may be increased due to the presence of the layer 230B, thereby enhancing the performance of the transistors 220, while maintaining the probability of creating deposition-related irregularities at a low level.

Figure 2D:
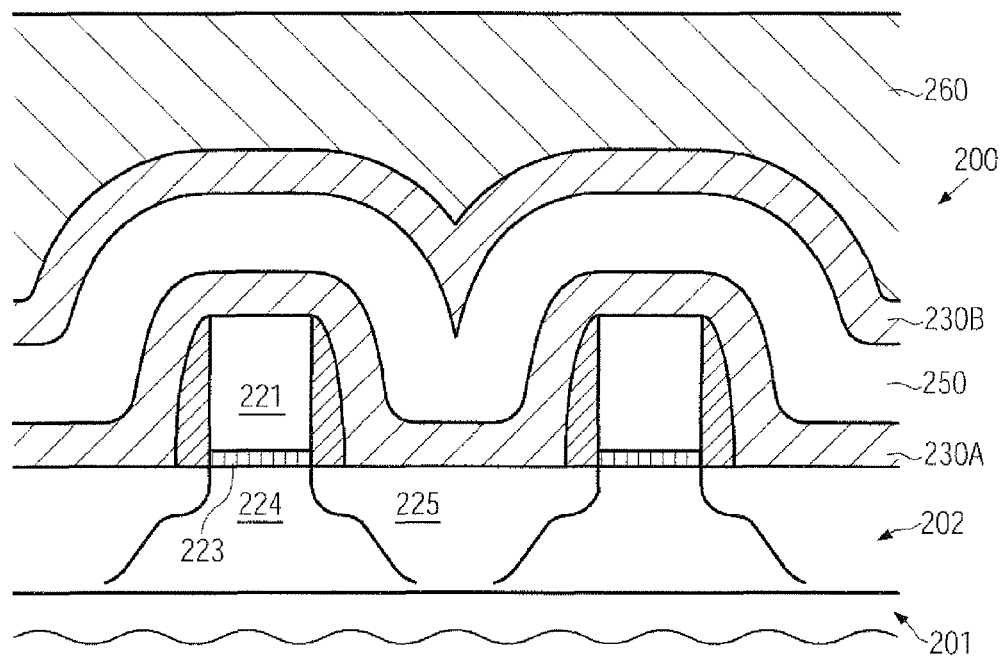

FIG. 2d schematically illustrates the semiconductor device 200 in a further advanced manufacturing stage. As shown, a final dielectric material 260 is formed above the stressed layer 230B with an average thickness that is greater than the average thickness of the buffer material 250, wherein, in the manufacturing stage shown, the material 260 may comprise a substantially planar surface topography as is advantageous for the lithography process to be performed for patterning the dielectric layer stack comprised of the materials 260, 230B, 250 and 230A. The final dielectric material 260 may be formed on the basis of any appropriate deposition technique, for instance, using CVD techniques for depositing silicon dioxide material, for instance using TEOS as a precursor material, thereby obtaining a high degree of compatibility with conventional manufacturing regimes for forming interlayer dielectric stacks. After the deposition of the material 260, appropriate planarization processes may be performed, for instance, using chemical mechanical polishing (CMP), wherein well-established recipes may be used for silicon dioxide based materials. Thereafter, an etch mask may be defined by photolithography, according to well-established strategies, and a first etch process may be performed to etch through the final dielectric material 260.

Figure 2E:
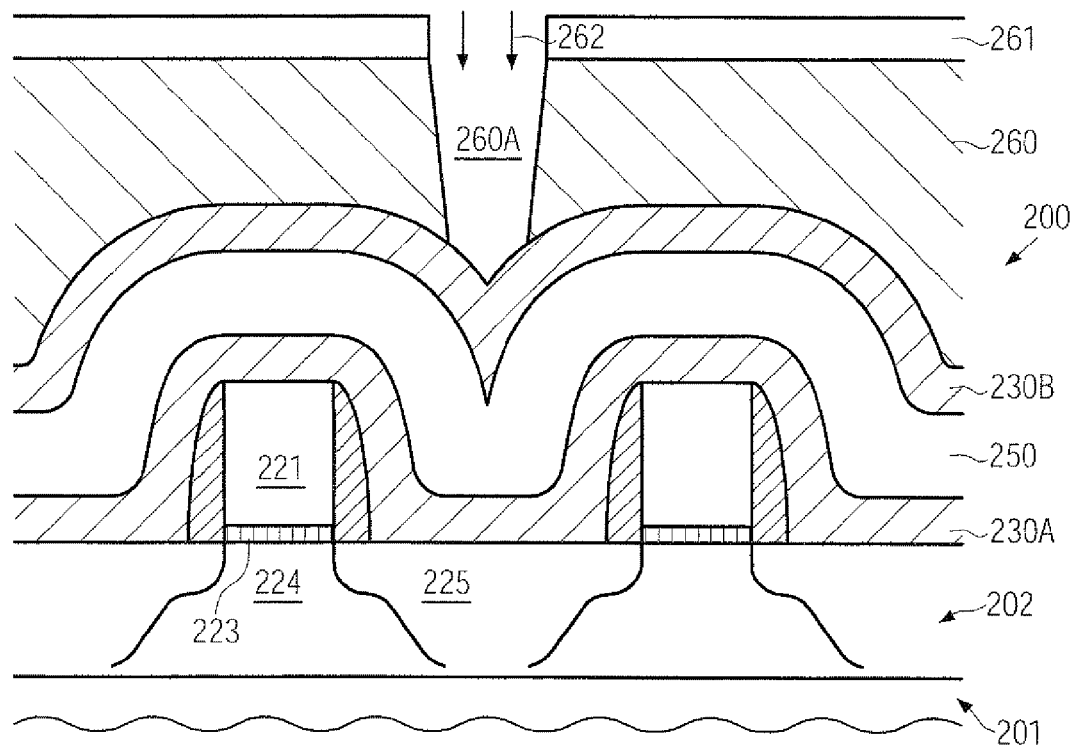

FIG. 2e schematically illustrates the device 200 during a respective etch process 262 on the basis of an etch mask 261 in order to provide an opening 260A in the material 260. The etch process 262 may be performed on the basis of well-established recipes when, for instance, silicon dioxide is provided for the final dielectric material 260. During the etch process 262, the layer 230B may act as an efficient etch stop material, thereby providing enhanced controllability of the etch process 262.

Figure 2F:
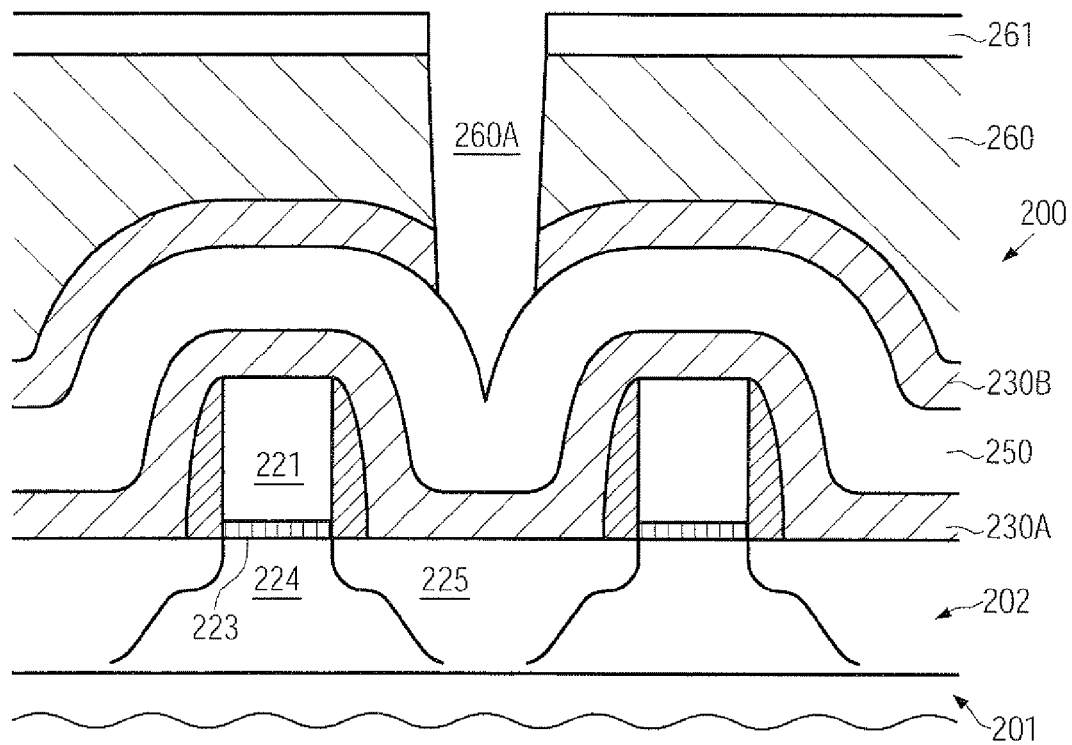

FIG. 2f schematically illustrates the semiconductor device 200 in a further advanced stage of the etch process 262, wherein the opening 260A extends through the layer 230B. For this purpose, an appropriate etch chemistry may be used to etch through the material of the layer 230B, wherein, in some illustrative embodiments, a respective selectivity to the buffer material 250 may be employed. In this case, the buffer material 250 may act as an etch stop material. In other cases, a pronounced selectivity of the etch recipe with respect to the materials of the layers 230B and 250 may not be required, since the average thickness 250T provides sufficient process margin so as to not unduly etch through the entire buffer material 250, through the layer 230A and into device areas of the transistor elements 220. Even if a reduced selectivity or no selectivity at all may be used, a time-controlled etch step may be performed to reliably stop the etch step within the buffer material 250. Thereafter, the etch chemistry may be changed to etch through the buffer material 250 while using the layer 230A as an efficient etch stop material. For example, well-established selective etch recipes for silicon dioxide and silicon nitride may be used, if the buffer material 250 is provided in the form of silicon dioxide material. In other illustrative embodiments, the etch process 262 as shown in FIG. 2e may be performed as a substantially non-selective etch process with respect to the materials of the layers 260 and 230B, wherein the etch process may be stopped within the buffer material 250 on the basis of a time-controlled etch step. Thereafter, the etch chemistry may be changed to provide an appropriated degree of selectivity with respect to the materials 250 and 230A. When performing the initial step of the etch process 262 as a substantially non-selective etch process, the overall process complexity of the patterning sequence may be reduced and may be comparable to conventional strategies.

Figure 2G:
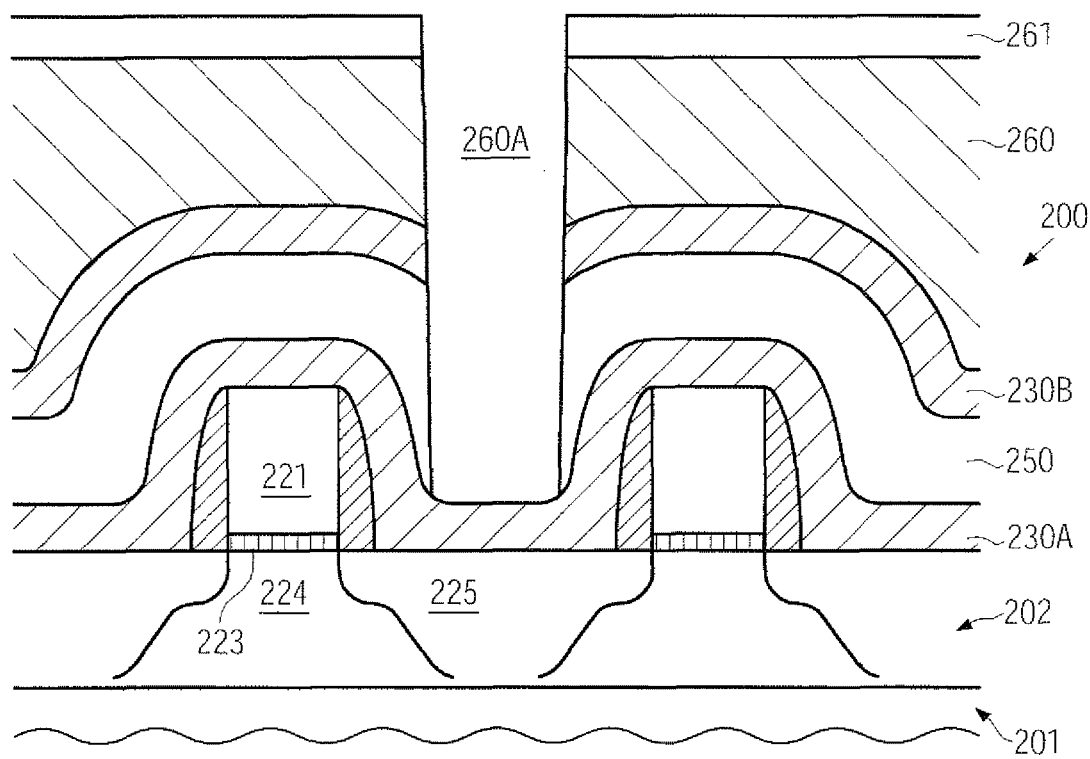

FIG. 2g schematically illustrates the semiconductor device 200 in a stage in which the opening 260A extends to the layer 230A, which may be accomplished on the basis of a highly selective etch process. Thereafter, the further processing may be continued on the basis of well-established techniques, i.e., the layer 230A may be opened such that the contact opening 260A connects to the transistor elements 220. Thereafter, the respective contact opening may be filled with an appropriate material, such as tungsten and the like, wherein well-established deposition techniques may be used.

It should be appreciated that in the embodiments described above with reference to FIGS. 2a-2g, the transistors 220 may represent transistor elements, which require tensile strain for enhancing the performance thereof. Furthermore, in this case, the doublet configuration provided by the layers 230A, 230B and the intermediate buffer material 250 may be highly advantageous in this case due to the significantly restricted gap-filling capabilities of a tensile stressed silicon nitride. In other cases, the transistors 220 may represent transistor elements requiring a compressively stressed dielectric material and also in this case the doublet configuration may be formed on the basis of a compressive material.

Figure 3A:
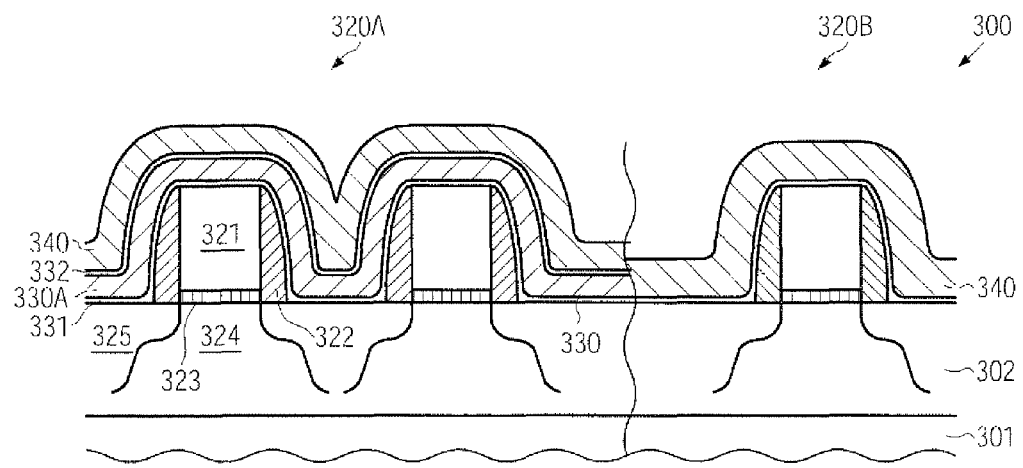
FIGS. 3a-3b schematically illustrate cross-sectional views of a semiconductor device including transistor elements of different type, above which are formed stressed dielectric materials of different type of internal stress, wherein a doublet configuration is provided above N-channel transistors for enhancing transistor performance thereof, according to further illustrative embodiments.
Figure 3B:
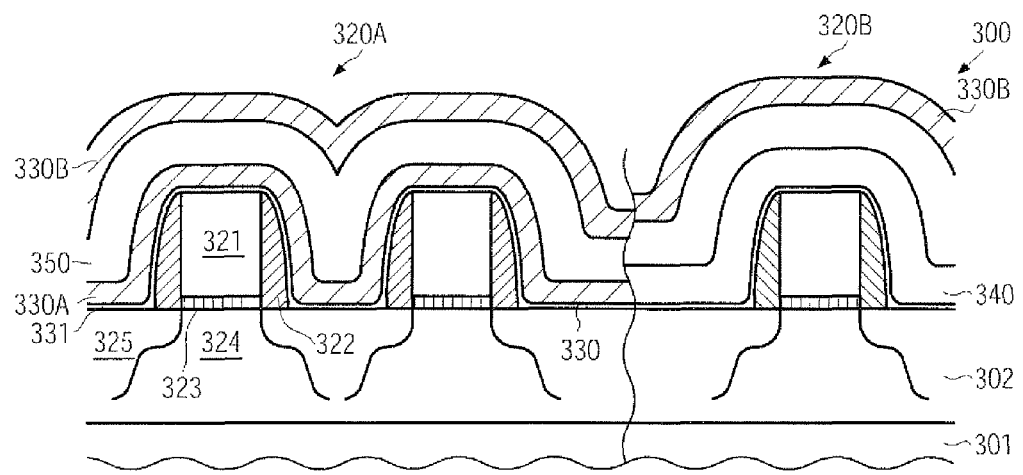

With reference to FIGS. 3a-3b, further illustrative embodiments will now be described in which the doublet configuration is applied to different types of transistors, requiring different types of internal stress, wherein at least one type of transistor, for instance, N-channel transistors, may obtain an increased amount of tensile stressed dielectric material, while a negative influence thereof on the other type of transistor may be overcompensated for by a respective compressively stressed dielectric material.

FIG. 3a schematically illustrates a semiconductor device 300 comprising a plurality of transistors 320A, which may represent N-channel transistors, and one or more transistors 320B, which may represent a P-channel transistor. The transistors 320A, 320B, except for the conductivity type, may have substantially the same configuration as previously described with reference to the devices 100 and 200. Hence, any respective components of the transistors 320A, 320B are denoted by the same reference signs, except for a "3" instead of a "2" or "1" as the first digit, and any further description of these components will be omitted. The same holds true for the substrate 301 and the semiconductor layer 302 of the semiconductor device 300.

Moreover, in the manufacturing stage shown, a stress-inducing layer 330A, in the embodiment shown, a tensile stressed dielectric material, may be formed above the transistors 320A, wherein, if required, an etch stop layer 331, for instance comprised of silicon dioxide, may be formed on the transistors 320A and optionally on the transistor 320B. With respect to the layer 330A, the same criteria apply as previously explained for the layer 230A. Thus, a substantially conformal configuration is obtained, thereby reducing the probability of creating deposition-related irregularities, in particular between the closely spaced transistors 320A. Furthermore, an etch stop or etch control layer 332 may be formed on the layer 330A followed by a stress-inducing layer 340, which may exhibit a different type of internal stress compared to the layer 330A. That is, in the embodiment shown, the material of layer 340 may have a high internal compressive stress. The layer 340 is also formed above the transistor 320B so as to induce a desired type of strain in the respective channel region 324.

The semiconductor device 300 may be formed on the basis of the following processes. After forming the transistors 320A, 320B on the basis of well-established techniques, the etch stop layer 331, if required, may be formed by well-established conformal deposition techniques, followed by the deposition of the layer 330A on the basis of similar process strategies as previously described with reference to the layer 230A. Thereafter, the etch stop or etch control layer 332 may be formed, for instance, in the form of silicon dioxide, followed by the deposition of the layer 340, which may be accomplished on the basis of less critical process parameters in view of gap-filling capabilities, since the respective RF power and thus surface diffusivity may be increased compared to the deposition of the layer 330A. Furthermore, the layer 330A may be provided in a highly conformal state, as previously explained, since a further tensile stressed material may be deposited in a later manufacturing stage, thereby also providing appropriate surface conditions for the deposition of the layer 340. Thereafter, an appropriate etch mask may be formed to cover the transistor 320B and expose the transistors 320A to an appropriately designed etch ambient for removing the exposed portion of the layer 340, wherein the respective etch process may be controlled on the basis of the etch stop or etch control layer 332.

FIG. 3b schematically illustrates the semiconductor device 300 in a further advanced manufacturing stage. As shown, a buffer material 350 is formed above the transistors 320A, 320B followed by a further tensile stressed dielectric layer 330B so as to increase the overall amount of tensile stressed material above the transistors 320A. As previously explained, the buffer material 350 may provide enhanced surface conditions for the further deposition of the material 330B with reduced probability for creating deposition-related irregularities. On the other hand, the buffer material 350 may reduce the efficiency of the stress of the layer 330B on the layer 340, thereby substantially not unduly affecting the overall performance of the transistor 320B. That is, typically, a compressively stressed silicon nitride material or nitrogen-containing silicon carbide material may be provided with a significantly higher internal stress level compared to a tensile stressed silicon nitride material, thereby resulting in an efficient strain-inducing mechanism. Moreover, as previously explained, the layer 340 may additionally be provided with increased thickness compared to the layer 330A, due to the less critical deposition parameters, which may also result in a highly efficient creation of compressive forces acting on the transistor 320B. Thus, the doublet structure above the transistors 320A, 320B may efficiently enhance the performance of the transistors 320A, while not unduly compromising the gain in performance obtained by the layer 340 in the transistor 320B.

Figure 4A:
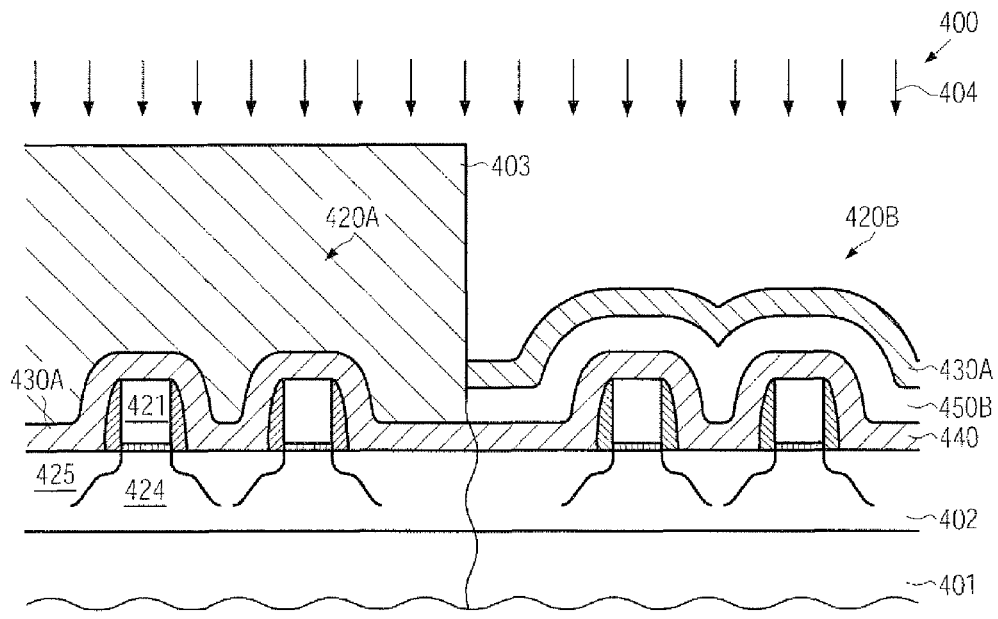
FIGS. 4a-4b schematically illustrate cross-sectional views of a semiconductor device during various manufacturing stages, wherein different types of transistors receive a doublet configuration, according to still other illustrative embodiments.
Figure 4B:
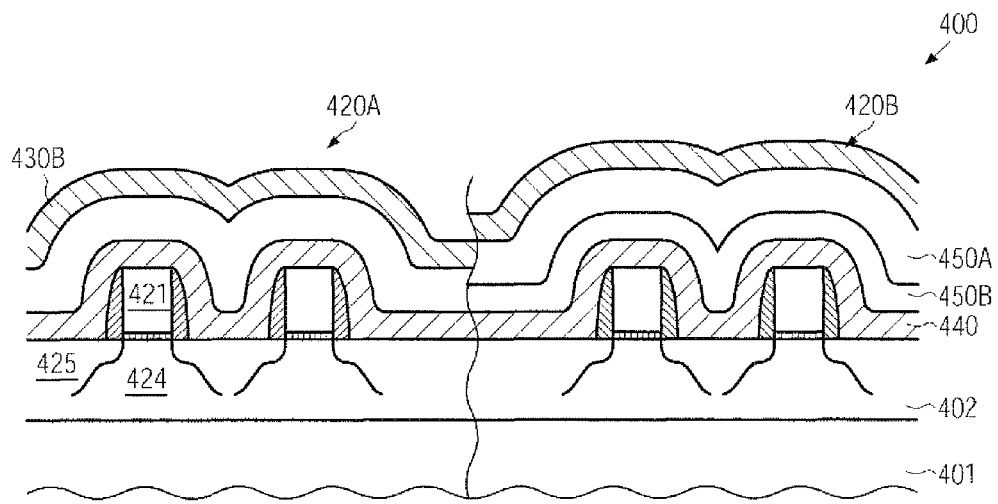

With reference to FIGS. 4a-4b, further illustrative embodiments will now be described in which buffer materials may be used during various manufacturing stages.

FIG. 4a schematically illustrates a semiconductor device 400 comprising a plurality of transistors 420A and 420B, which may have substantially the same configuration as previously described. The transistors 420A, 420B may be formed above a substrate 401 comprising a semiconductor layer 402. For the components described so far, the same criteria apply as previously explained. Furthermore, the components of the transistors 420A, 420B may be denoted by the same reference signs as in the previously described embodiments except for a "4" as the first digit. Hence, any detailed description thereof will be omitted. In the manufacturing stage shown, a stress-inducing layer 440 may be formed above the transistor 420B followed by a first buffer material 450B, which may comprise any appropriate material, such as silicon dioxide. Furthermore, a stress-inducing layer 430A is formed above the transistors 420A and on the buffer layer 450B. As shown, the layers 430A, 440 may be provided in a substantially conformal configuration, as previously explained. That is, the layer 440 may be formed with an appropriate deposition technique followed by the deposition of the buffer layer 450B, which may be provided with any appropriate thickness so as to relax the surface topography created by the deposition of the layer 440. In some illustrative embodiments, a thickness of the buffer layer 450B may be comparable or even less than the thickness of the layer 440, while nevertheless providing enhanced gap-filling capabilities so as to reliably fill the gaps between adjacent transistors. For this purpose, any appropriate deposition technique, such as a thermally activated CVD process, may be used, as previously described. Next, the layer 440 and the buffer material 450B may be removed from above the transistors 420A by appropriately designed masking and etch techniques. Next, the layer 430A is deposited so as to obtain a highly conformal deposition behavior, as previously explained. It should be appreciated that, due to the provision of the buffer layer 450B, a substantially void-free and seamless deposition of the layer 430A may also be accomplished above the transistors 420B, thereby enhancing the process conditions during a subsequent etch process performed on the basis of an etch mask 403 to remove the layer 430A from above the transistors 420B. Thus, during the etch process 404, the material of the layer 430A may be reliably removed, wherein the process 404 may be controlled on the basis of the buffer material 450B. Hence, exposure of the layer 440 to the ambient of the etch process 404 may be avoided, since the buffer material 450B, now acting as an etch stop material, may be provided with sufficient thickness of approximately 30-80 nm, for example, so that even a significant amount of the buffer material 450B may be maintained after the etch process 404.

FIG. 4b schematically illustrates the semiconductor device 400 in further advanced manufacturing stage, in which a further buffer material 450A is formed above the transistors 420A, 420B followed by a further stress-inducing layer 430B having the same internal type of stress as the layer 430A so as to enhance performance of the transistors 420A. On the other hand, in addition to enhancing the overall process efficiency during the deposition of the layer 430A and removal thereof above the transistor 420B, the remaining buffer material 450B in combination with the buffer material 450A may provide an increased distance of layer 430A with respect to the stress-inducing layer 440. Hence, any negative impact on the transistors 420B caused by the presence of the layer 430A may further be reduced. The increased thickness of the buffer material provided above the transistors 420B compared to the transistor 420A may not substantially negatively influence the further processing of the device 400, since, for instance, after the deposition of a final dielectric material and the patterning thereof, using, for instance, the layer 430B as an efficient etch stop material, the selectivity between the buffer materials 450A, 450B and the layers 440 and 430A may nevertheless provide sufficient process uniformity, since the additional thickness of the layer 450B may not result in undue material removal of the layer 430A.

As a result, the subject matter disclosed herein provides techniques and semiconductor devices in which performance of at least one type of transistor may be significantly enhanced by increasing the amount of stressed dielectric material, while not contributing to deposition-related irregularities, such as voids and seams. For this purpose, the deposition of a stressed dielectric material may be "split" into two parts with an intermediate buffer material formed on the basis of a technique having enhanced gap-filling capabilities. For example, the critical deposition of tensile stressed dielectric material may be performed in two steps with an intermediate deposition step for providing an appropriate buffer material, for instance, silicon dioxide, to provide a doublet structure in the corresponding interlayer dielectric layer stack. Furthermore, the doublet configuration for one type of transistor elements may be advantageously used in combination with different transistor types, wherein the doublet structure may not unduly affect performance of the other type of transistor requiring a different type of stress compared to the type of stress provided by the doublet configuration. In this case, in some illustrative embodiments, even an enhanced overall deposition and patterning regime may be obtained on the basis of the doublet configuration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
conformally forming a first stress-inducing layer above a first transistor and a second transistor formed above a substrate, said first stress-inducing layer generating a first type of stress;
forming a first dielectric layer above said first stress-inducing layer, said first dielectric layer having an internal stress level less than a stress level of said first stress-inducing layer;
selectively removing said first stress-inducing layer and said first dielectric layer from above said first transistor, a portion of said first dielectric layer remaining above said second transistor;
forming a second stress-inducing layer above said first transistor and said portion of said first dielectric layer, said second stress-inducing layer inducing a second type of stress different from said first type of stress;
selectively removing said second stress-inducing layer from above said second transistor using said portion of said first dielectric layer as an etch stop material;
forming a second dielectric layer directly on said second stress-inducing layer above said first transistor and directly on said portion of said first dielectric layer remaining above said second transistor;
forming a third stress-inducing layer directly on second dielectric layer and above said first and second transistors, said third stress-inducing layer inducing said second type of stress; and
forming an interlayer dielectric layer above said third stress-inducing layer.

2. The method of claim 1, further comprising forming a contact opening in said interlayer dielectric layer.

3. The method of claim 1, wherein said first type of stress is a tensile stress.

4. The method of claim 1, wherein said first dielectric layer is deposited so as to reduce height differences in a surface topography generated by said first stress-inducing layer.

5. The method of claim 4, wherein said first dielectric layer is deposited with an average layer thickness that is greater than the thickness of said first stress-inducing layer.

6. The method of claim 5, wherein said second dielectric layer is deposited with an average thickness that is greater than said average thickness of said first dielectric layer.

7. The method of claim 1, further comprising forming a contact opening extending through said interlayer dielectric layer and said first and second dielectric layers, wherein said first and second stress-inducing layers act as etch stop layers when sequentially etching said first and second dielectric layers.

8. The method of claim 1, wherein said first and second stress-inducing layers comprise silicon nitride.

9. The method of claim 1, wherein said first and second dielectric layers are comprised of the same material.

10. A method, comprising:
forming a first stress-inducing dielectric layer above a first transistor and a second transistor in a conformal manner by using a first deposition technique, said first stress-inducing layer inducing a first type of stress;

forming a first buffer layer above said first stress-inducing layer by using a second deposition technique having an increased gap-filling capability compared to said first deposition technique;

selectively removing said first stress-inducing layer and said first buffer layer from above said first transistor, a portion of said first buffer layer remaining above said second transistor;

forming a second stress-inducing layer above said first transistor and said portion of said first buffer layer, said second stress-inducing layer inducing a second type of stress different from said first type of stress;

selectively removing said second stress-inducing layer from above said second transistor using said portion of said first buffer layer as an etch stop material;

forming a second buffer layer directly on said second stress-inducing layer above said first transistor and directly on said portion of said first buffer layer above said second transistor;

forming a third stress-inducing layer directly on said second buffer layer and above said first and second transistors, said third stress-inducing layer inducing said second type of stress; and forming an interlayer dielectric layer above said second buffer layer.

11. The method of claim 10, wherein said first deposition technique comprises a plasma enhanced deposition process.

12. The method of claim 11, wherein said second deposition technique comprises a thermally activated chemical vapor deposition process.

13. The method of claim 11, wherein said first stress-inducing dielectric layer is a tensile stressed layer.

14. The method of claim 11, wherein a thickness of said first stress-inducing dielectric layer is less than an average thickness of said first buffer layer.

* * * * *